(12) United States Patent
Wang et al.

(10) Patent No.: US 6,444,561 B1
(45) Date of Patent: Sep. 3, 2002

(54) METHOD FOR FORMING SOLDER BUMPS FOR FLIP-CHIP BONDING BY USING PERPENDICULARLY LAID MASKING STRIPS

(75) Inventors: Chia-Chung Wang, Bode; Chung-Tao Chang; Kuo-Chuan Chen, both of Hsinchu, all of (TW)

(73) Assignee: Industrial Technology Research Institute, Chutung (TW)

( * ) Notice: Subject to any disclaimer, the term of this patent is extended or adjusted under 35 U.S.C. 154(b) by 12 days.

(21) Appl. No.: 09/677,491

(22) Filed: Oct. 2, 2000

(51) Int. Cl.7 ............................................. H01L 21/44
(52) U.S. Cl. ...................................... 438/612; 438/613
(58) Field of Search ................................... 438/612–617

(56) References Cited

U.S. PATENT DOCUMENTS 5,767,010 A * 6/1998 Mis et al. ................... 438/612
5,880,017 A * 3/1999 Schwiebert et al. ........ 257/737
6,348,401 B1 * 2/2002 Chen et al. ................. 438/614

* cited by examiner

Primary Examiner—John F. Niebling
Assistant Examiner—Angel Roman
(74) Attorney, Agent, or Firm—Tung & Associates

(57) ABSTRACT

A method for forming solder bumps for a flip-chip bonding process wherein the bumps have substantially the same height and structures formed by the method are described. In the method, a pre-processed semiconductor substrate that has a plurality of metal traces formed on a top surface is first provided. At least two solder non-wettable masking strips are then deposited on top of and perpendicular to the plurality of metal traces. The at least two solder non-wettable masking strips are deposited spaced-apart at a predetermined spacing sufficient for forming a bond pad therein-between on the plurality of metal traces. Finally, a solder material is deposited onto the bond pads forming solder bumps which are then reflown into solder balls.

10 Claims, 2 Drawing Sheets

METHOD FOR FORMING SOLDER BUMPS FOR FLIP-CHIP BONDING BY USING PERPENDICULARLY LAID MASKING STRIPS

FIELD OF THE INVENTION

The present invention generally relates to a method for forming solder bumps for a flip-chip bonding process and structures formed and more particularly, relates to a method for forming solder bumps that have substantially the same height for flip-chip bonding wherein a gap for flowing an underfill material in-between a chip and a substrate is increased to reduce fill time and structures formed by the method.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique.

For instance, in a conventional thin film electrodeposition process for depositing solder bumps, bond pads are first formed on a top surface of a substrate for making electrical connections to the outside circuits. The bond pads are normally formed of a conductive metal such as aluminum. The bond pads may be passivated in a passivation layer with windows opened by a photolithography process to allow electrical connections to be made to the bond pads. The passivation layer may be formed of any one of various insulating materials such as oxide, nitride or organic materials. The passivation layer is applied on top of the semiconductor device to provide both planarization and physical protection of the circuits formed on the device. Onto a top surface of the passivation layer and an exposed top surface of the bond pads, is then deposited an under bump metallurgy (UBM) layer. The under bump metallurgy layer normally consists of an adhesion/diffusion barrier layer and a wetting layer. The adhesion/diffusion barrier layer may be formed of Ti, TiN or other metal such as Cr. The wetting layer is normally formed of a Cu layer or a Ni layer. The UBM layer improves bonding between a solder ball to be formed and the top surface of the bond pads.

In the next step of the process, a photoresist layer is deposited on top of the UBM layer and patterned to define window openings for the solder balls to be subsequently formed. In the following electrodeposition process, solder balls are electro-deposited into window openings forming a structure protruding from the top surface of the photoresist layer. The use of the photoresist layer must be carefully controlled such that its thickness is in the range between about 30 $\mu$m and about 40 $\mu$m, or preferably a thickness of about 35 $\mu$m. The reason for the tight control on the thickness of the photoresist layer is that, for achieving a fine-pitched solder bump formation, a photoresist layer of a reasonably small thickness must be used so that high imaging resolution can be achieved. It is known that, during a photolithography process, the thicker the photoresist layer, the poorer is the imaging process achieved. To maintain high accuracy in the imaging process on the photoresist layer, reasonably thin photoresist layer must be used resulting in a mushroom configuration of the solder bump deposited therein. The mushroom shape of the solder bump contributes to the inability of a conventional process in producing fine-pitched solder bumps.

The photoresist layer is then removed in a wet stripping process. The mushroom-shaped solder bump remains while the UBM layer is also intact. In the next step of the process, the UBM layer is etched away by using the solder bumps as a mask in a wet etching process. The solder bumps are then heated in a reflow process to form solder balls. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide a larger number of input/output terminals than that possible from a conventional quad flat package.

In a typical micro-BGA package, a flexible interposer or underfill layer (which may contain circuit) is used to interconnect bond pads on an IC chip to an array of solder bump connections located on a flexible circuit. The flexible circuit, normally of a thickness of approximately 25 $\mu$m, is formed of a polymeric material such as polyimide which is laminated to a silicon elastomer layer of approximately 150 $\mu$m thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

The conventional method for depositing solder bumps described above utilizing solder masks presents a number of processing difficulties. For instance, one of the difficulties is the possible misalignment of a solder mask used during a solder bump deposition process. This is shown in FIGS. 1 and 3. For instance, FIGS. 1A and 1B illustrate a conventional solder masking process that does not have a solder mask misalignment problem. When a solder mask 10 is positioned on a semiconductor substrate 20 which has a metal trace 22 and a bond pad 24 formed on a top surface, an opening 12 in the solder mask 10 should be aligned with the bond pad 24. Under an ideal processing condition shown in FIGS. 1A and 1B, the opening 12 is perfectly aligned with the bond pad 24 and the metal trace 22 and thus, a ball-limiting-metallurgy (BLM) layer (not shown) deposited on the bond pad 24 limits the reflow of a solder bump (not shown) into a perfectly shaped solder ball 30 which covers entirely the bond pad 24.

However, under normal fabrication conditions, the solder mask 10 is frequently misaligned to the semiconductor substrate 20 resulting in defectively formed solder balls 30, as shown in FIGS. 1D and 1F. For instance, in FIGS. 1C and 1D, solder mask 10 is misaligned to the semiconductor substrate 20 since mask 10 is positioned too far to the right of the bond pad 24. After a solder bump (not shown) is deposited into the opening 12 in the mask 10, an unusually tall solder ball 30 is formed due to the fact that only a partial surface area of the bond pad 24 is covered so that there is insufficient bond pad area for the solder ball to spread out and assume its normal height. This is shown in FIG. 1D.

In another occurrence of misalignment, as shown in FIGS. 1E and 1F, the solder mask 10 is positioned too far to the left in relation to the bond pad 24 such that both the bond pad 24 and the metal trace 22 are covered by a solder bump subsequently deposited into the opening 12. After a solder reflow process, a solder ball 30 is formed, as shown in FIG. 1F, with a smaller height since the ball covers a larger surface area (i.e. covers a BLM layer) and not only the bond pad area.

The detrimental effect of a misalignment between the solder mask 10 and the semiconductor substrate 20 is shown in FIGS. 3A and 3B. For instance, FIG. 3A illustrates that the solder mask 10 with openings 12 provided therein overlaps a plurality of bond pads 24 and metal traces 22. The center bond pad 24 is only partially covered by the opening 12, while bond pad 24 on the two ends are covered by the opening 12 together with a portion of the metal trace 22. As a result, solder balls 32 of smaller than normal height and solder ball 34 of larger than normal height are produced, as shown in FIG. 3B, after a solder reflow process. After an integrated circuit chip (or die) 40 with bond pads 42 formed thereon is positioned over the semiconductor substrate 20 which has the solder balls 32,34 formed thereon, the solder ball 34 which has the larger height contacts the bond pad 42 while the solder balls 32 which has the smaller height are unable to make contact with the bond pads 42. The bonding defect can thus lead to serious quality and reliability problems in the semiconductor package formed by the IC die 40 and the semiconductor substrate 20.

Another processing difficulty encountered in a conventional solder bump formation process that utilizes solder masks is the formation of voids in-between the solder balls and the solder mask. Furthermore, the rate of filling a gap between an IC die and a semiconductor substrate with an underfill material is also reduced. FIG. 2 illustrates the problem wherein a solder mask 10 with openings 12 formed therein is used. It is seen that, while solder balls 30 bond satisfactorily with the bond pads 42, the opening 12 between the solder balls 30 and the mask 10 is very small. This leads to a flow problem for a subsequently filled underfill material which is unable to completely fill the gap, leading to the formation of voids in the gap. Moreover, a gap 14 of very small size is formed in-between the IC die 40 and the semiconductor substrate 20 due to the presence of the solder mask 10 that remained on top of the semiconductor substrate 20 after the solder reflow process. Since a wet stripping process is usually time consuming and costly, a solder mask 10 that is formed of an insulating material is usually left in a package. The small gap 14 formed in-between the die 40 and the substrate 20 therefore limits the filling rate of an underfill material during a final underfill process.

It is therefore an object of the present invention to provide a method for forming solder bumps for flip-chip bonding that does not have the drawbacks or shortcomings of the conventional solder bump forming process.

It is another object of the present invention to provide a method for forming solder bumps for flip-chip bonding that allows a solder mask to be left in a bonded package without the usual processing problem caused by the presence of the solder mask.

It is a further object of the present invention to provide a method for forming solder bumps for flip-chip bonding without utilizing a solder mask with openings therein for forming the solder bumps.

It is another further object of the present invention to provide a method for forming solder bumps for flip-chip bonding by utilizing a solder mask that has a specifically designed configuration and a small surface area.

It is still another object of the present invention to provide a method for forming solder bumps for flip-chip bonding that allows the formation of solder balls of substantially the same height.

It is yet another object of the present invention to provide a method for forming solder bumps for flip-chip bonding which produces a package having a large gap therein to allow rapid filling of an underfill material.

It is still another further object of the present invention to provide an electronic package that includes a semiconductor substrate, an IC chip, a plurality of solder balls bonding the IC chip to the semiconductor substrate, and a plurality of solder non-wettable masks situated in-between the plurality of solder balls wherein a total volume occupied by the plurality of solder non-wettable masks is less than 50% of the total volume of the gap formed between the semiconductor substrate and the IC chip.

It is yet another further object of the present invention to provide an electronic package that includes a semiconductor substrate, an IC chip, a plurality of solder balls each having substantially the same height for bonding the IC chip to the semiconductor substrate, and a plurality of solder non-wettable masks situated in-between the plurality of solder balls.

SUMMARY OF THE INVENTION

In accordance with the present invention, a method for forming solder bumps for flip-chip bonding and structures formed by the method are provided.

In a preferred embodiment, a method for forming solder bumps of uniform height can be carried out by the operating steps of providing a pre-processed semiconductor substrate that has a plurality of metal traces formed on top; depositing at least two solder non-wettable masking strips on top of and perpendicular to the plurality of metal traces, the at least two solder non-wettable masking strips are deposited spaced-apart at a predetermined spacing sufficient for forming a bond pad therein between on the plurality of metal traces; and depositing a solder material onto the bond pad forming solder bumps.

In the method for forming solder bumps of uniform height, the pre-processed semiconductor substrate may be an integrated circuit chip, or a printed circuit board. The method may further include the step of forming at an extreme end of the plurality of metal traces a bond pad, or the step of depositing ball-limiting-metallurgy layers on the bond pad. The method may further include the step of depositing the at least two solder non-wettable masking strips in a material selected from the group consisting of thermally cured epoxies and UV cured acrylates, or the step of depositing the at least two solder non-wettable masking strips by a technique selected from the group consisting of stencil printing, dry film laminating and liquid photoimageable coating. The method may further include the step of depositing the solder material onto the bond pad by a technique selected from the group consisting of solder dipping, electrodeposition, electroless deposition and stencil printing.

The method for forming solder bumps of uniform height may further include the steps of reflowing the solder bumps into solder balls; bonding the solder balls to conductive pads on an opposite surface of a second semiconductor substrate; and filling a gap between the first and the second semiconductor substrates with an underfill material. The method may further include the step of keeping the at least two solder non-wettable masking strips in the semiconductor substrate such that a gap formed between the first and the second semiconductor substrate is increased.

The present invention is further directed to an electronic package that includes a semiconductor substrate; an IC chip; a plurality of solder balls bonding the IC chip to the semiconductor substrate; a plurality of solder non-wettable masking strips situated in-between the plurality of solder balls, a total volume of the plurality of solder non-wettable masking strips being less than 50% of the total volume of a gap formed between the semiconductor substrate and the IC chip; and an underfill material filling the gap between the semiconductor substrate and the IC chip.

In the electronic package, the package may further include a plurality of conductive traces formed on a top surface of the semiconductor substrate, the plurality of conductive traces may be formed of copper or aluminum. The layer of solder non-wettable masking strips may be selected from the group consisting of thermally cured epoxies and UV curable acrylates. The underfill material may be selected from the group consisting of polyimide, silicon adhesive and epoxy. The electronic package may be a flip-chip package. The layer of solder non-wettable masking strips situated in-between the plurality of solder balls may be formed of elongated strips overlapping partially the plurality of conductive traces formed on either the semiconductor substrate or on the IC chip. The plurality of solder balls may have substantially the same height.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for forming solder bumps that have uniform height and for achieving improved underfill fill rate after a subsequent bonding process between an IC chip and a semiconductor substrate.

The method of the present invention can be carried out advantageously by the operating steps of first providing a pre-processed semiconductor substrate which has a plurality of metal traces formed on top; depositing at least two solder non-wettable masking strips on top of and perpendicular to the plurality of metal traces, the at least two solder non-wettable masking strips are deposited spaced-apart at a predetermined spacing sufficient for forming a bond pad therein between on the plurality of metal traces; then depositing a solder material onto the bond pads forming solder bumps. The pre-processed semiconductor substrate may be an integrated circuit chip, a printed circuit board or any other semiconductor substrate.

The invention method for forming solder bumps may be integrated into a method for forming electronic packages between an IC die and a semiconductor substrate. The method for packaging may further include the steps of reflowing the solder bumps into solder balls; bonding the solder balls to conductive pads on an opposite surface of a second semiconductor substrate; and filling a gap between the first and the second semiconductor substrates with an underfill material. The solder non-wettable masking strips utilized in the present invention method enables a gap formed between the first and the second semiconductor substrate to be reduced without reducing the fill rate of an underfill material in a subsequent process. The invention method provides significantly improved cycle time for the fabrication of such electronic packages.

The invention further provides an electronic package that includes a semiconductor substrate; an IC chip; a plurality of solder balls bonding the IC chip to the semiconductor substrate; a plurality of solder non-wettable masking strips situated in-between the plurality of solder balls, a total volume occupied by the plurality of solder non-wettable masking strips is less than 50% of the total volume, or preferably, less than 30% of the total volume of the gap formed between the semiconductor substrate and the IC chip; and an underfill material filling a gap between the semiconductor substrate and the IC chip. The top surface of the semiconductor substrate may further include a plurality of conductive traces, or a plurality of conductive traces and bond pads formed thereon.

Figure 4A:
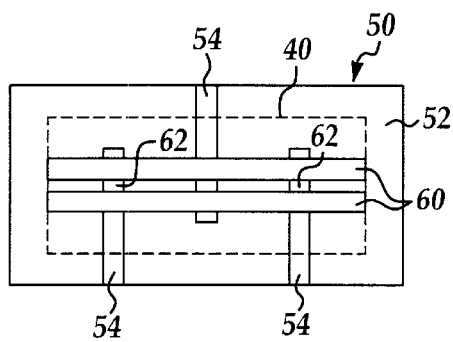
FIG. 4A is an enlarged, plane view of the present invention solder mask positioned on top of a semiconductor substrate which has metal traces formed on top.

Referring now to FIG. 4A wherein a present invention semiconductor substrate 50 is shown. The semiconductor substrate 50 has a top surface 52 onto which a plurality of metal traces, or routing traces 54 are formed. The present invention novel method, instead of applying a whole sheet of a solder mask (not shown) onto the top surface 52 of the substrate, only applies a plurality of masking strips 60 onto the top surface 52 perpendicular to and partially covers the plurality of metal traces 54. The masking strips 60 leave an area 62 between the two strips uncovered which is suitably used as bond pads. As shown in FIG. 4A, the ghost line indicates an IC die 40 that the substrate 50 is later bonded to. The plurality of masking strips 60 may be advantageously formed of an insulating or dielectric material such as a thermally cured epoxy or a UV curable acrylate. The masking strips 60 may be advantageously deposited by a technique such as stencil printing, dry film laminating and liquid photo-imageable coating. A more preferred method is stencil printing which can be carried out at a faster speed and lower cost.

Figure 4B:
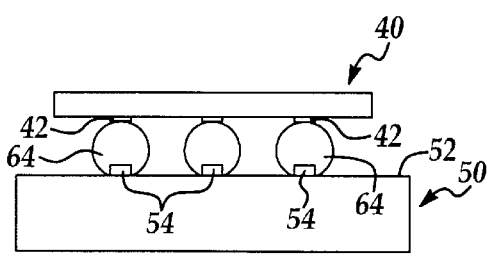
FIG. 4B is an enlarged, cross-sectional view of an IC chip bonded to a semiconductor substrate equipped with solder balls formed by the present invention solder masking technique.

After the plurality of masking strips 60 are deposited perpendicularly and partially to cover the metal traces 54, a solder material, i.e. a solder paste, may be deposited on the bond pad 62 left uncovered by the masking strips 60. A suitable technique for depositing the solder, or the solder paste material, may be a stencil printing technique, a solder dipping technique, an electrodeposition technique or an electroless deposition technique. The solder bumps (not shown) deposited on the bond pads 62 are then reflown in a solder reflow process conducted at a temperature higher than the reflow temperature of the solder material. A suitable solder to be used may be one that contains 63% Pb and 37% Sn. During the solder reflow process, since the plurality of masking strips 60 are formed of solder non-wettable materials, the solder balls formed from the solder bumps stay strictly on top of the bond pad area 62 and thus any shifting of the solder balls can be avoided. As shown in FIG. 4B, solder balls 64 are preferentially formed on top of the metal traces 54, i.e. the bond pad 62. The processing difficulty encountered in the conventional method in aligning openings in a solder mask with bond pads on a semiconductor substrate resulting in solder balls of different heights is thus eliminated.

Figure 5A:
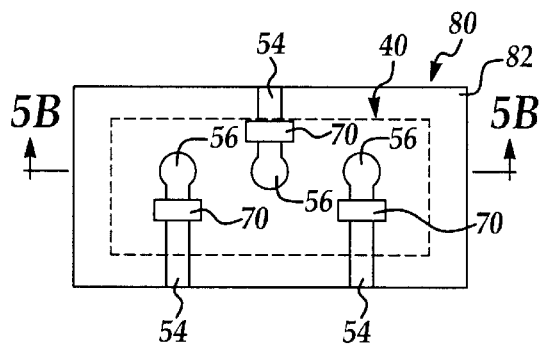
FIG. 5A is an enlarged, plane view of a present invention solder mask placed on top of a semiconductor substrate equipped with a plurality of metal traces and bond pads on a top surface.
Figure 5B:
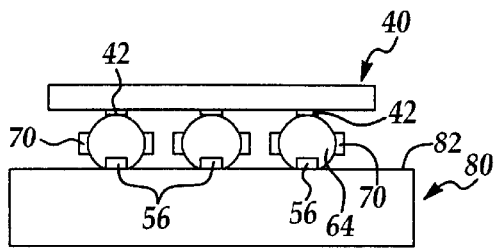
FIG. 5B is an enlarged, cross-sectional view of an IC chip bonded to the semiconductor substrate formed in FIG. 5A by the present invention technique.

A second embodiment of the present invention novel method is shown in FIG. 5A wherein the metal traces 54 are further provided with a bond pad portion 56 which may further be covered by a BLM layer (not shown). In this embodiment, short portions of the masking strips 70 are applied on top of the metal traces 54 to isolate the bond pad portion 56. A solder or solder paste material is then applied to the top surface 82 of the semiconductor substrate 80 to cover the isolated bond pad 56 on the metal traces 54. Solder bumps (not shown) are thus perfectly aligned on top of the bond pad 56 and then reflown into solder balls 64, as shown in FIG. 5B. It should be noted that the sectional view of FIG. 5B is taken along line BB of FIG. 5A. Another sectional view taken along a section that is perpendicular to section BB is shown in FIG. 5C.

Figure 1A:
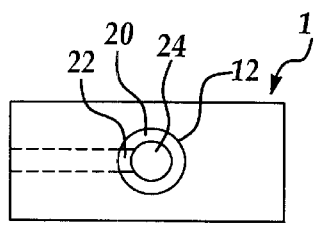
FIG. 1A is an enlarged, plane view of a conventional solder mask positioned over a semiconductor substrate with an opening of the mask exposing a bond pad on the substrate.
Figure 1B:
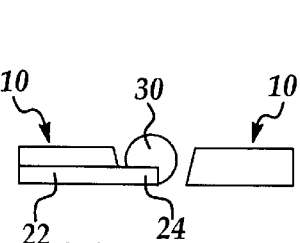
FIG. 1B is an enlarged, cross-sectional view of the conventional solder mask/semiconductor substrate of FIG. 1B.
Figure 1C:
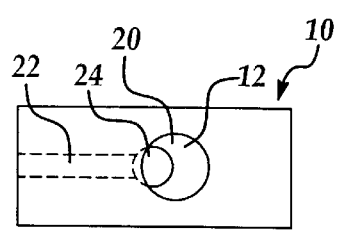
FIG. 1C is an enlarged, plane view of the solder mask/semiconductor substrate of FIG. 1A with the mask misaligned to the right of the semiconductor substrate.
Figure 1D:
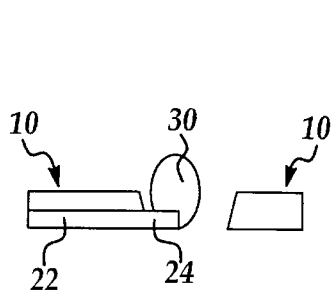
FIG. 1D is an enlarged, cross-sectional view of the conventional solder mask/semiconductor substrate of FIG. 1C.
Figure 1E:
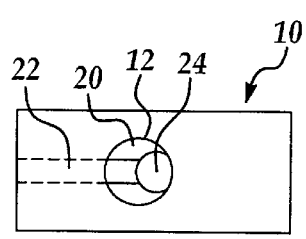
FIG. 1E is an enlarged, plane view of the conventional solder mask/semiconductor substrate of FIG. 1A with the solder mask misaligned to the left of the semiconductor substrate.
Figure 1F:
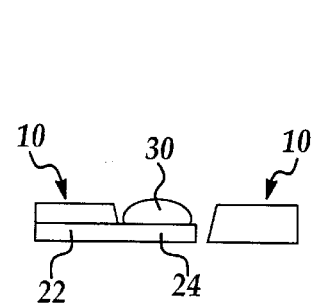
FIG. 1F is an enlarged, cross-sectional view of the conventional solder mask/semiconductor substrate of FIG. 1E.
Figure 2:
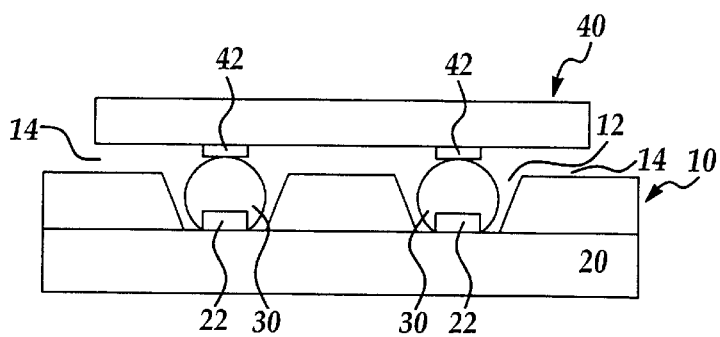
FIG. 2 is an enlarged, cross-sectional view of an IC chip bonded to a semiconductor substrate that has solder balls formed thereon by a conventional solder masking technique.
Figure 3A:
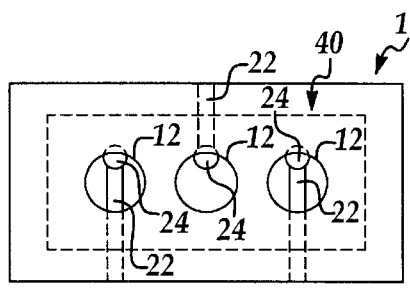
FIG. 3A, is an enlarged, plane view of a conventional solder mask positioned on top of a semiconductor substrate equipped with bond pads on a top surface illustrating the misalignment between openings in the mask and the bond pads.
Figure 3B:
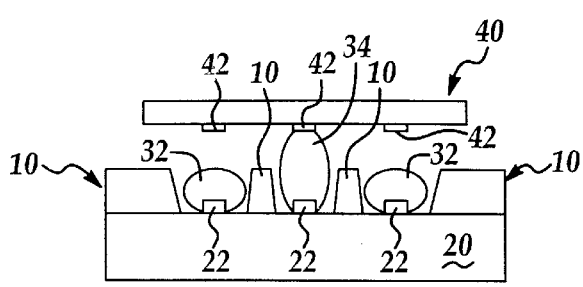
FIG. 3B is an enlarged, cross-sectional view of the conventional structure of FIG. 2 wherein the solder balls formed are not of the same height.
Figure 5C:
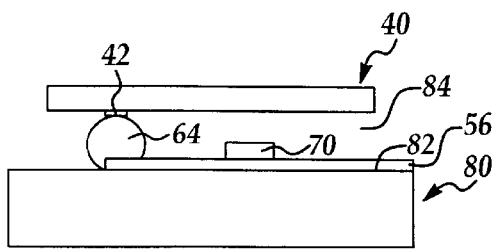
FIG. 5C is an enlarged, cross-sectional view similar to that of FIG. 5B but taken in a perpendicular direction.

Another processing advantage made possible by the present invention is shown in FIG. 5C, when compared to FIG. 2. Since only masking strips 60 (shown in FIG. 4A) or portions of masking strips 70 (shown in FIG. 5C) are used in the present invention novel method, the gap in-between the IC chip 40 and the semiconductor substrate 80 is not blocked off by a sheet of a solder masking material, such as that used in a conventional solder bump forming method. The process for filling the gap 84 in-between the IC chip 40 and the semiconductor substrate 80 becomes substantially easier and a substantially faster flow rate of an underfill material can be realized, which further improves the fabrication yield of the packaging process.

The present invention novel method for forming solder bumps that have substantially uniform height for flip-chip bonding and structures formed by the method have therefore been amply described in the above description and in the appended drawings of FIGS. 4A–5C.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming solder bumps of uniform height comprising the steps of:
   providing a pre-processed semiconductor substrate having a plurality of metal traces formed on top;
   depositing at least two solder non-wettable masking strips on top of and perpendicular to said plurality of metal traces, said at least two solder non-wettable masking strips being deposited spaced-apart at a predetermined spacing sufficient for forming a bond pad therein between on said plurality of metal traces; and
   depositing a solder material onto said bond pads forming solder bumps.

2. A method for forming solder bumps of uniform height according to claim 1, wherein said pre-processed semiconductor substrate is an integrated circuit chip.

3. A method for forming solder bumps of uniform height according to claim 1, wherein said pre-processed semiconductor substrate is a printed circuit board.

4. A method for forming solder bumps of uniform height according to claim 1 further comprising the step of forming at an extreme end of said plurality of metal traces a bond pad.

5. A method for forming solder bumps of uniform height according to claim 4 further comprising the step of depositing ball-limiting-metallurgy layers on said bond pad.

6. A method for forming solder bumps of uniform height according to claim 1 further comprising the step of depositing said at least two solder non-wettable masking strips in a material selected from the group consisting of thermally cured epoxies and UV curable acrylates.

7. A method for forming solder bumps of uniform height according to claim 1 further comprising the step of depositing said at least two solder non-wettable masking strips by a technique selected from the group consisting of stencil printing, dry film laminating and liquid photo-imageable coating.

8. A method for forming solder bumps of uniform height according to claim 1 further comprising the step of depositing said solder material onto said bond pad by a technique selected from the group consisting of solder dipping, electrodeposition, electroless deposition and stencil printing.

9. A method for forming solder bumps of uniform height according to claim 1 further comprising the steps of:

reflowing said solder bumps into solder balls;

bonding said solder balls to conductive pads on an opposite surface of a second semiconductor substrate; and filling a gap between the first and the second semiconductor substrates with an underfill material.

10. A method for forming solder bumps of uniform height according to claim 1 further comprising the step of keeping said at least two solder non-wettable masking strips in said semiconductor substrate such that a gap formed between said first and said second semiconductor substrates is increased.

* * * * *